(12) United States Patent
Piesinger

(10) Patent No.: US 10,976,349 B1
(45) Date of Patent: Apr. 13, 2021

(54) PHASE IDENTIFICATION DISPLAY METHOD

(71) Applicant: Gregory Hubert Piesinger, Cave Creek, AZ (US)

(72) Inventor: Gregory Hubert Piesinger, Cave Creek, AZ (US)

(*) Notice: Subject to any disclaimer, the term of this patent is extended or adjusted under 35 U.S.C. 154(b) by 0 days.

(21) Appl. No.: 17/091,703

(22) Filed: Nov. 6, 2020

Related U.S. Application Data

(60) Provisional application No. 62/906,796, filed on Sep. 27, 2019.

(51) Int. Cl.
| | | |
|---|---|---|
| *G01R 19/00* | (2006.01) | |
| *G01R 29/16* | (2006.01) | |
| *G01R 13/02* | (2006.01) | |
| *G01R 29/18* | (2006.01) | |
| *G01R 25/00* | (2006.01) | |
| *G01R 21/133* | (2006.01) | |
| *G01R 19/25* | (2006.01) | |
| *G01R 15/14* | (2006.01) | |
| *G01R 21/06* | (2006.01) | |
| *H02M 1/00* | (2006.01) | |
| *H02M 7/5395* | (2006.01) | |

(52) U.S. Cl.
CPC ..... *G01R 13/0236* (2013.01); *G01R 13/0245* (2013.01); *G01R 15/142* (2013.01); *G01R 19/0092* (2013.01); *G01R 19/2513* (2013.01); *G01R 21/06* (2013.01); *G01R 21/133* (2013.01); *G01R 25/005* (2013.01); *G01R 29/16* (2013.01); *G01R 29/18* (2013.01); *H02M 7/5395* (2013.01); *H02M 2001/0009* (2013.01)

(58) Field of Classification Search
CPC .. G01R 21/133; G01R 29/16; G01R 19/2513; G01R 15/142; G01R 19/0092; G01R 21/06; G01R 13/0236; G01R 13/0245; G01R 25/005; G01R 29/18; H02M 2001/0009; H02M 7/5395
USPC ............. 324/72, 76.11–76.83, 107, 140
See application file for complete search history.

(56) References Cited

U.S. PATENT DOCUMENTS

| | | | | |
|---|---|---|---|---|
| 2003/0184275 A1* | 10/2003 | Slade | ............. | G01R 29/18 324/66 |
| 2013/0066576 A1* | 3/2013 | CS | ............. | G01R 25/08 702/67 |
| 2015/0022180 A1* | 1/2015 | Piesinger | ............. | G01R 25/00 324/66 |

* cited by examiner

*Primary Examiner* — Raul J Rios Russo

(57) ABSTRACT

Methods are described to provide a new and improved display of phase identification measurements in a three-phase power distribution network, that is easier and more intuitive to interpret and define tagging reference phase. A short sequence of individual phase measurements are displayed as dots inside a static phase attribute display circle. The 3 primary, 12 secondary, and 6 three-phase attributes are displayed around the outside of the phase circle. When using a touch screen Smartphone or Tablet display device, the user simply touches inside the phase circle to rotate the dots around the center of the phase circle, so they line up with the known conductor phase attribute. This rotation defines the tagging reference phase for the circuit.

12 Claims, 5 Drawing Sheets

PHASE IDENTIFICATION DISPLAY METHOD

RELATED INVENTION

The present invention claims priority under 35 U.S.C. § 119(e) to: "Phase Identification Display Method" Provisional U.S. Patent Application Ser. No. 62/906,796, filed Sep. 27, 2019 which is incorporated by reference herein.

TECHNICAL FIELD OF THE INVENTION

The present invention relates to the field of three-phase power distribution networks. More specifically, the present invention relates to the field of identifying the phase of a conductor in a three-phase power distribution network.

BACKGROUND OF THE INVENTION

Electric power distribution networks are used by the electric utilities to deliver electricity from generating plants to customers. Although the actual distribution voltages will vary from utility to utility, in a typical network, three-phase power at high voltage 345,000 volts phase-to-phase (345 KV) is delivered to multiple high voltage substations at which transformers step this high voltage down to a lower three-phase voltage 115 KV. Multiple transmission substations further lower the voltage to 69 KV. This 69 KV three-phase power then feeds multiple distribution substations whose transformers further step down the voltage to the distribution voltage (12,470 volts phase-to-phase) and separate the power into three single-phase feeder cables. Typically, these feeder cables operate at 7,200 volts phase-to-ground. Each of these feeder cables branch into multiple circuits to power a plurality of local pole-mounted or pad-mounted transformers which step the voltage down to a final voltage of 120 and 240 volts for delivery to commercial and residential customers.

The instantaneous phases of the three conductors in a three-phase system are separated by 120 degrees. A phase attribute of A, B, or C is typically assigned to each of the three conductors to identify them. The initial assignment of phase attribute to each of the three conductors typically takes place at a transmission or distribution substation and this assignment is somewhat arbitrary. The attributes assigned at the substations become known as the tagging reference phases for that substation because the goal is to consistently tag, mark, or identify each conductor with its proper phase attribute throughout the substation's distribution region.

Most currently available phase identification instruments use GPS timing signals to obtain instantaneous phase measurements at a reference location and field location at the same instant of time. The phase attribute at the reference location is known which allows the phase attribute at the field location to be determined.

Piesinger's, U.S. Pat. No. 8,570,024 issued Oct. 29, 2013 describes a Non-Contact Phase Identification Method and Apparatus and is incorporated herein by reference. It uses an innovative method that allows the phase of all 3 high overhead 3-phase conductors to be determined from a single phase measurement.

Currently, all phase identification instruments indicate conductor phase as a discrete attribute, typically derived from one or two phase measurements. This is a handicap in cases where line voltage glitches produce phase measurements that don't match, causing the lineman to have to repeat the phase measurements.

Accordingly, it is the object of the present invention to provide a new and improved method for setting up the initial tagging reference phase and for displaying the results of phase identification measurements that are easier and more intuitive for the lineman to perform and interpret.

SUMMARY OF THE INVENTION

Briefly, to achieve the desired objects of the present invention, each phase measurement consists of a short sequence of individual phase measurements that are displayed as dots on a static phase attribute display. For example, assume a measurement consists of 6 independent measurements taken one second apart. Also, assume 4 of the measurement dots indicate a similar phase while 2 of the measurement dots deviate widely from the position of the 4 dots due to voltage glitches. These 2 measurement dots can simply be ignored by the lineman and the true phase measurement recognized as being indicated by the close cluster of the 4 similar phase dots.

It is a further object of the present invention to implement a new innovative method of setting up the tagging reference phase. Tagging reference phase is described in U.S. Pat. No. 8,570,024 and simply refers to the process of defining which of the 3-phase conductors are assigned the phase attributes A, B, and C.

These and other embodiments are discussed below.

DETAILED DESCRIPTION OF THE PREFERRED EMBODIMENTS

Commonly owned U.S. Pat. No. 8,570,024 issued Oct. 29, 2013 describes the theory of operation of the Non-Contact Phase Identification Instrument. Currently, 2 phase measurements are taken 2 seconds apart and the phase attribute and phase error (in degrees) from the tagging reference phase for the 2 measurements are indicated on a display. If the deviation between the 2 phase errors is large, the display states that the phase attributes don't match, and the measurement pair must be retaken.

Phase identification measurements are typically taken on single phase and 3-phase primary circuits and on secondary circuits. The format of the new innovative phase attribute display is designed to support and display phase measurements on each of these 3 types of circuits.

Figure 1:
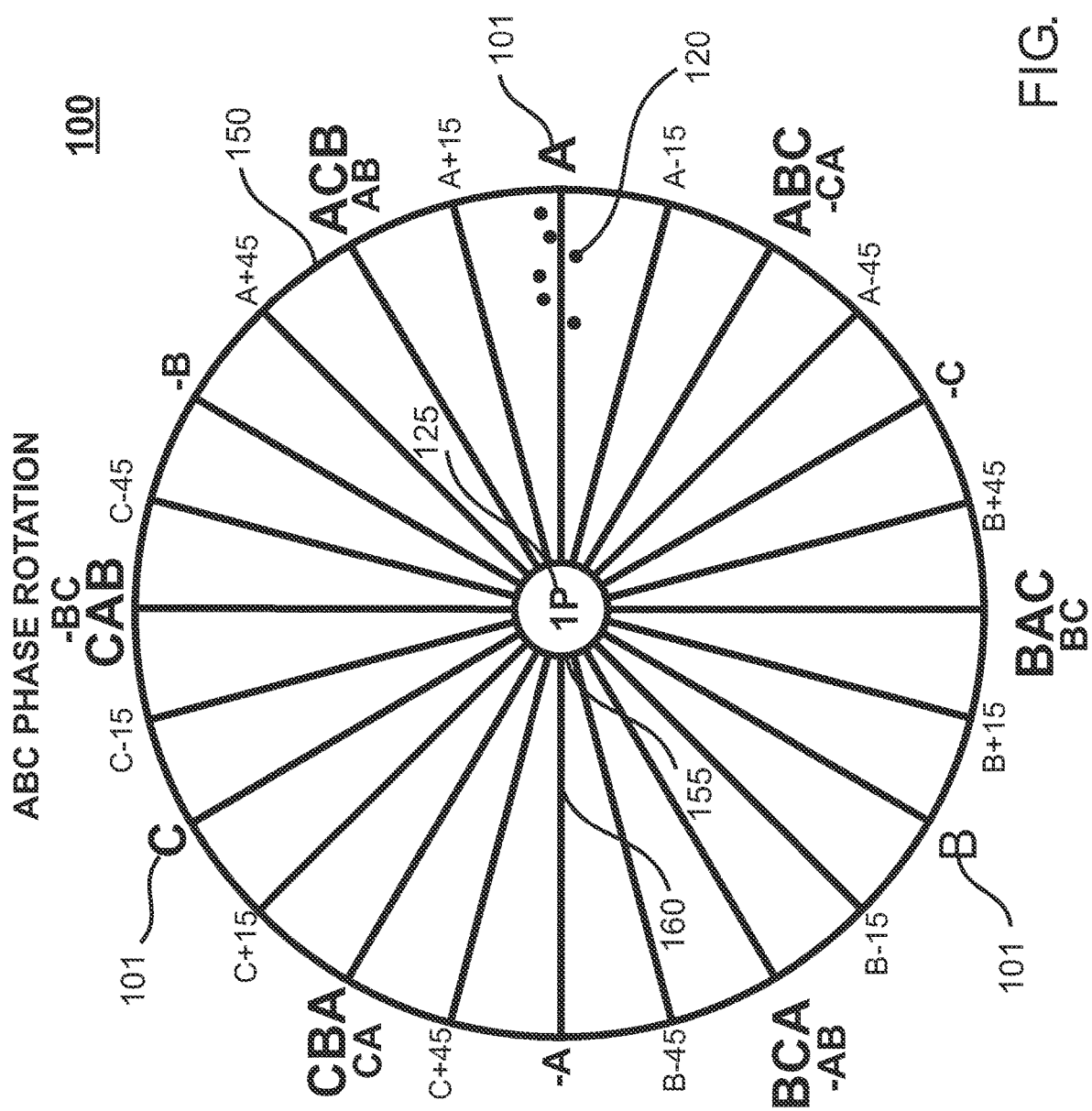
FIG. 1 illustrates the static phase attribute display for ABC phase rotation, on which a sequence of individual phase measurements dots are displayed. The three primary phase attributes (A,B,C) are identified.

Phase attribute display 100 is illustrated in FIG. 1. Phase attribute display 100 is composed of outer circle 150, inner circle 155, circle spokes 160 every 15 degrees, and phase attributes every 30 degrees around outside outer circle 150. The three primary phase attributes 101 (A,B,C) are identified. Phase attribute display 100 is static in that it doesn't change or rotate.

Six phase measurement dots 120 taken on phase A of a single phase primary circuit are illustrated. Dots 120 indicate the conductor is phase A because dots 120 are clustered close to phase attribute A.

If the single phase primary circuit was phase B, dots 120 would be clustered close to phase attribute B. Likewise, if phase C, dots 120 would be clustered close to phase attribute C.

To setup the initial tagging reference phase for this single phase primary circuit, the lineman would first take a phase measurement on a single phase primary conductor he knows to be phase A (or phase B or C). For this initial measurement, dots 120 could appear at any phase position on phase attribute display 100. Since the lineman knows the circuit is phase A, he would simply rotate the group of dots 120 around the center point of outer circle 150 to position them on phase attribute A as illustrated in FIG. 1.

The rotated position of the dots defines the tagging reference phase and is stored in a named configuration file on the display device. The configuration file would be named to define the tagging reference phase, along with other display device setup information, for phase measurements on this particular single phase primary circuit. Similar configuration files would be defined and named for other types of circuits or for similar circuits in different areas of the electric utility.

Whenever returning to a previous circuit area, the lineman would simply load the configuration file for that area and continue to make additional phase measurements without having to redefine the tagging reference phase, or any other display device setup information, for that area.

As an additional enhancement, circuit type 1P designation 125 illustrated in FIG. 1 reminds the lineman of which circuit type (single phase primary, 3-phase primary, or secondary) the configuration file defines. Other designations might be 3P for 3-phase circuits, or S for secondary circuits.

Circuit type 1P designation 125 illustrated in FIG. 1 can be any designation desired. For example, type C designation 125 might be used to designate a phase measurement made using the "current-to-voltage adapter 235" described in Commonly owned U.S. Pat. No. 10,551,426 issued Feb. 4, 2020.

Figure 2:
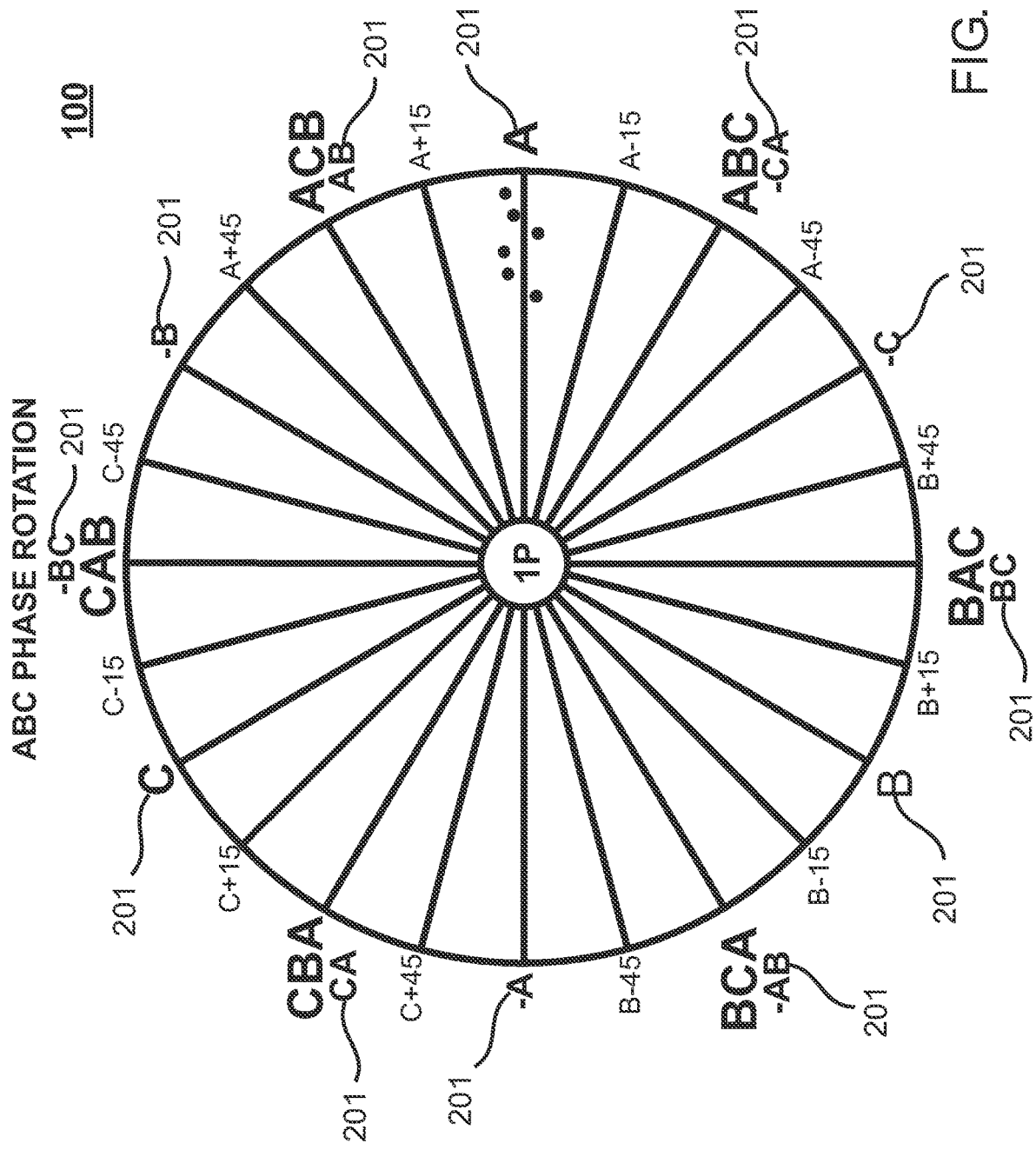
FIG. 2 identifies the twelve secondary phase attributes (A, AB, -B, -BC, C, CA, -A, -AB, B, BC, -C, -CA) displayed in FIG. 1.

Phase attribute display 100 for secondary circuits is illustrated in FIG. 2. For secondary circuits there are 12 possible phase attributes 201. For example, a pole mounted transformer might have its primary 7200 volt input circuit connected across single phase primaries A & B. If so, the secondary voltage would be measured as phase AB attribute 201.

Another example is the common 120/240 volt house voltage supplied by a typical neighborhood 7200 volt to 120/240 volt padmount transformer. If the transformer were connected to single phase primary phase A, then the house voltage would be supplied with 120 volt phase A and 120 volt phase -A. Since the two 120 volt conductors are out of phase, by connecting large appliances such as air conditioners or stoves across the out-of-phase conductors, 240 volts is supplied to these appliances. Lighting and normal 120 volt wall sockets are connected from a single 120 volt conductor to ground.

In FIG. 2, measuring an in-phase wall socket would place phase dots 120 near phase A attribute 201 while measuring an out-of-phase wall socket would place phase dots 120 near phase -A attribute 201. If the padmount were connected to single phase primary phase B instead of phase A, then phase dots 120 would be near phase B attribute 201 or phase -B phase attribute 201. Likewise, any of the 12 secondary phase attributes 201 could be indicated depending on how the primary to secondary transformer was connected across single or 3-phase primaries.

Commonly owned U.S. Pat. No. 8,570,024 issued Oct. 29, 2013 describes the theory of operation of a Non-Contact Phase Identification Instrument when used to take a single phase measurement on high overhead 3-phase lines from ground level, when holding the field probe in a position so the 3-phase conductors are in a near, center, far relationship from the field probe.

Figure 3:
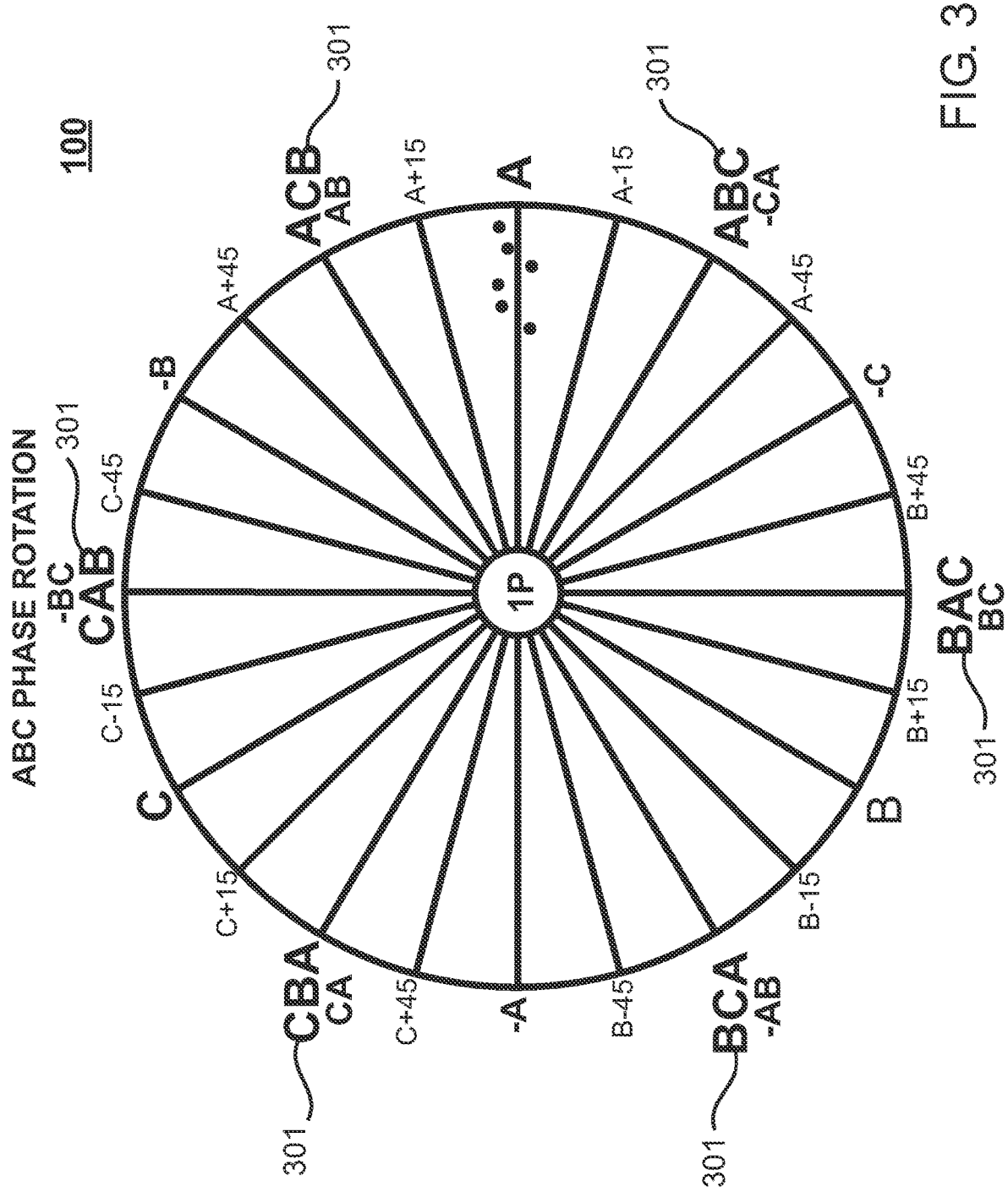
FIG. 3 identifies the six 3-phase attributes (ABC, ACB, CAB, CBA, BCA, BAC) displayed in FIG. 1.

Phase attributes for phase measurements on these 3-phase conductors are illustrated in FIG. 3. If the 3-phase conductors are in a near, center, far relationship of phase A, B, C with respect to the field probe, then measurement dots 120 would be positioned near phase ABC attribute 301. Likewise, dots 120 would be near phase ACB attribute 301 if the conductors were in a near, center, far relationship of phase A, C, B.

There are a total of 6 separate near, center, far relationships possible for 3-phase conductors which are illustrated as phase attributes 301 in FIG. 3. As high voltage overhead 3-phase primary circuits always occur as a closely spaced group of 3 conductors, it is essentially not possible to find an isolated high voltage conductor to use to setup the tagging reference phase.

Phase attribute display 100 illustrated in FIG. 3 makes it easy to setup tagging reference phase for these high voltage 3-phase circuits. The lineman simply finds a convenient location in which the near, center, far phase attributes for the lines are known. This might be accomplished by tracing the conductors to a point that is a short distance from a substation in which the phases are physically marked and therefore known.

The lineman then simply takes a phase measurement and rotates measurement dots 120 to position them next to the correct phase attribute 301.

Figure 4:
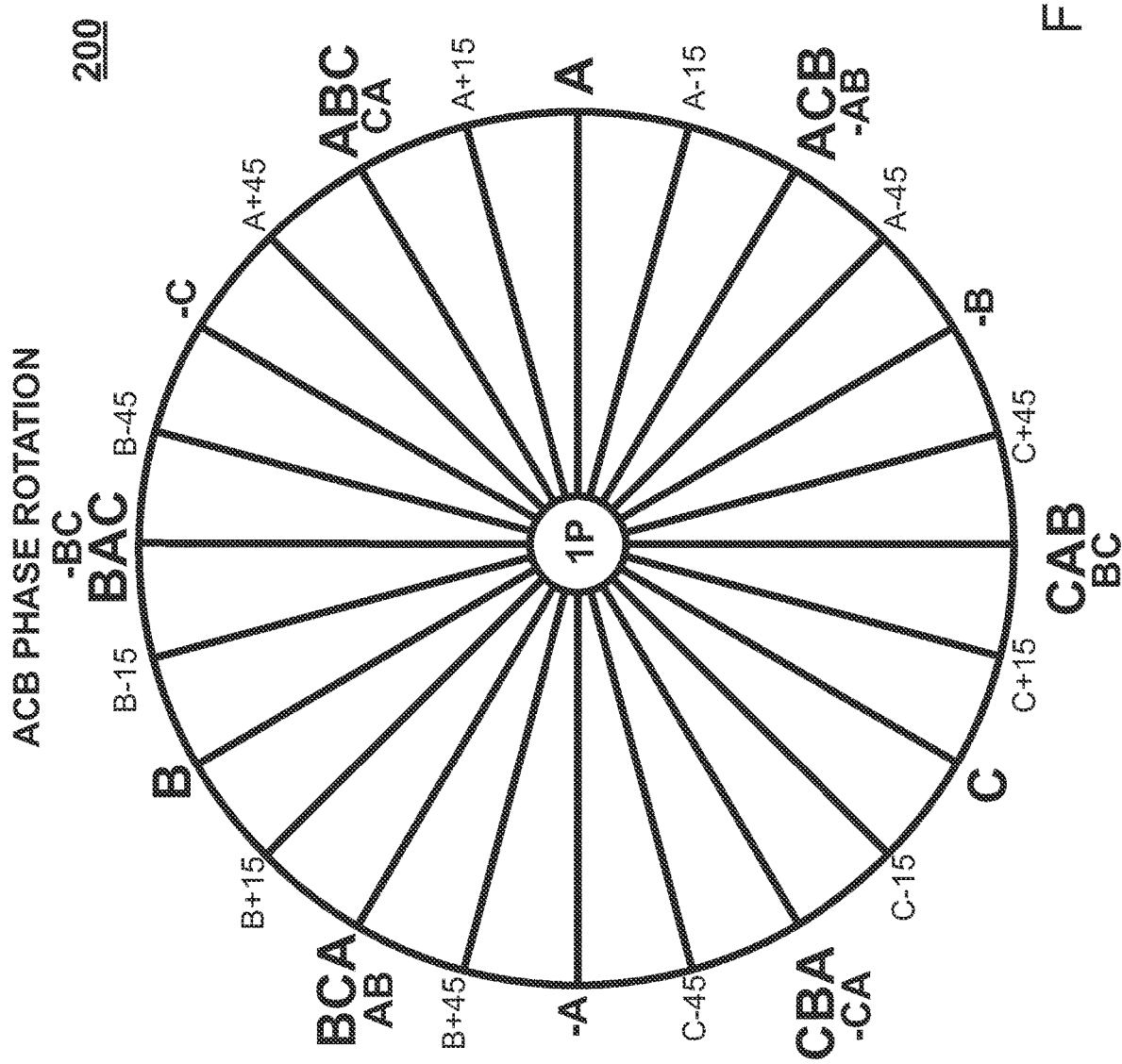
FIG. 4 illustrates the static phase attribute display for ACB phase rotation.

The phase rotation of 3-phase conductors is designated as either ABC (clockwise ABC rotation) or ACB (clockwise ACB rotation). Some utilities implement ABC rotation while other utilities implement ACB rotation. To accommodate either rotation, phase attribute display 200 is created as illustrated in FIG. 4. Its construction and use are similar to the ABC rotation phase circle illustrated in FIG. 1. The proper static phase attribute display (100 or 200) is stored in the named configuration file on the display device.

To improve readability on color displays, circle spokes 160, and phase attributes (101, 201, and 301) illustrated in FIG. 1, FIG. 2, and FIG. 3 respectively can be color coded such that all phase A attributes and spokes are red, all phase B attributes and spokes are green, and all phase C attributes and spokes are blue. Primary phase A, B, and C spokes are colored black. Other colors could be used if desired. These colors help define the boundaries between each of the primary A, B, and C phases. Additionally, the phase dots could also be colored to match their displayed location.

Phase attribute display (100 or 200) can be implemented on any display desired. However, it is most appropriately implemented as a mobile App on Smartphones or Tablets with a touch screen display. As phase attribute display (100 or 200) is static, the user can easily rotate measurement dots 120 simply by touching and moving their finger inside outer circle 100 to rotate dots 120 to the appropriate phase attribute to setup tagging reference phase.

As illustrated in FIG. 1, each measurement dot 120 is most appropriately placed at a slightly different radius. This prevents measurement dots 120 from stacking up on each other. Experience indicates a selection of 3, 6, or 9 measurement dots per phase measurement taken, in which the first dot 120 is placed at a maximum radius, and subsequent dots 120 placed at consecutively shorter radius, provides the optimum user experience.

FIG. 1 through FIG. 4 illustrate typical measurement dot 120 placements when the probe is stationary during the phase measurements.

Figure 5:
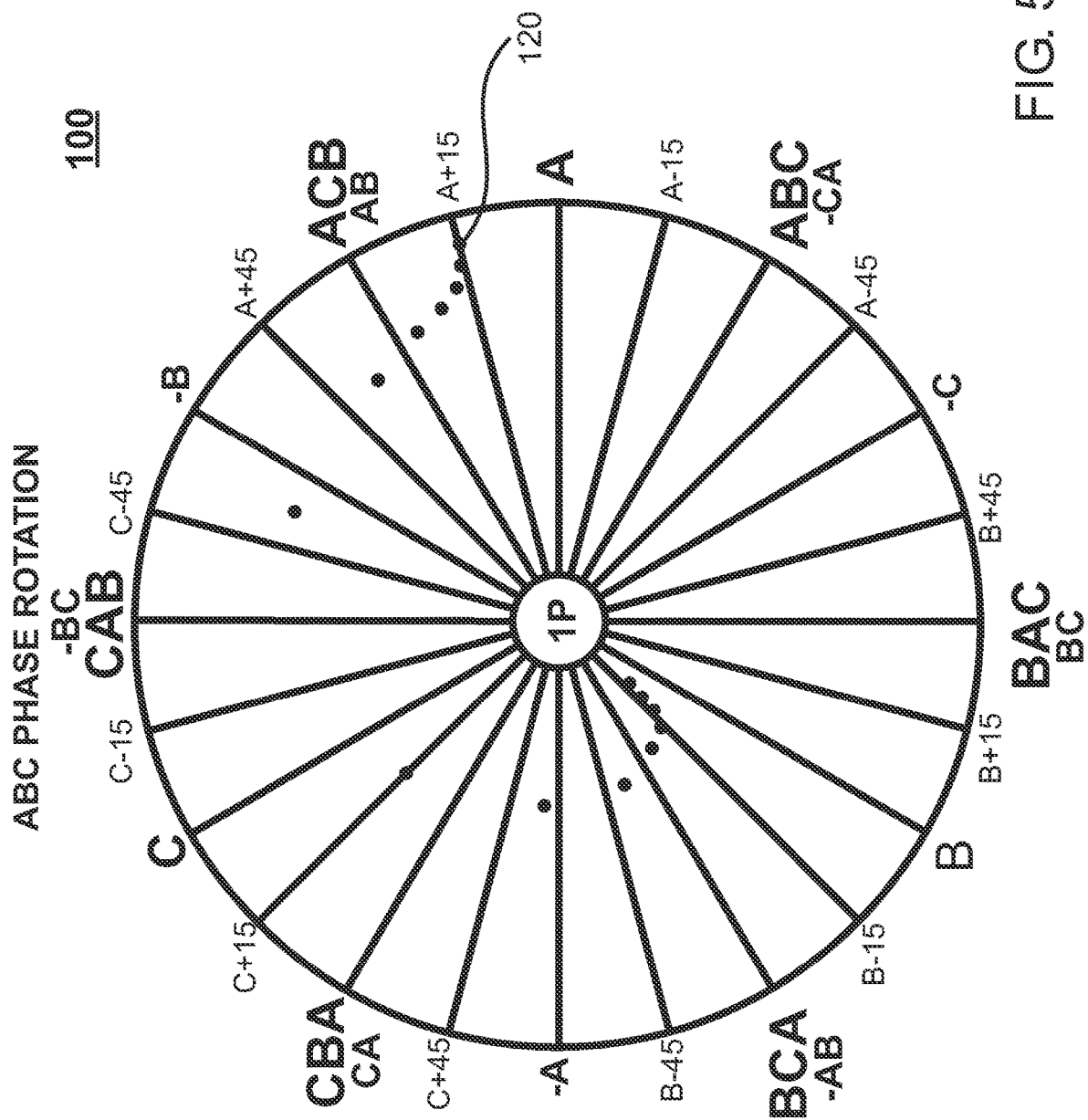
FIG. 5 illustrates a sequence of 15 individual phase measurements dots obtained while moving towards, under, and away from 3-phase overhead lines whose near, center, far proximity is ACB.

However, when the probe is moving during the multiple dot phase measurement sequence, there is an advantage to increasing the number of measurements to more than 9. For example, FIG. 5 illustrates 15 measurement dots 120 obtained when approaching, moving under, and then moving away from overhead horizontal 3-phase conductors. The shape of this dot pattern can then be compared to a collection of calculated dot patterns made from a variety of different conductor configurations.

That is, the lineman could identify the near, center, far phase attributes of overhead lines by simply approaching, moving under, or moving away from actual energized conductors and comparing the dot pattern obtained from a collection of dot patterns simulated for a similar line configuration. For example, if the near, center, far lines were ACB, the dot pattern would start near phase ACB attribute and end near phase BCA attribute as illustrated in FIG. 5.

Dot patterns can be calculated for any type of overhead line construction. These dot patterns can be stored in a manual or on the display device and be compared to the actual dot pattern obtained by the lineman while driving towards, under, or away from any number of overhead lines. This technique would allow phasing complex line constructions, like underbuild, where both 3-phase transmission and distribution lines are mounted on the same pole.

Although the preferred embodiments of the invention have been illustrated and described in detail, it will be readily apparent to those skilled in the art that various modifications may be made therein without departing from the spirit of the invention. For example, if a touch screen display is not available, measurement dot 120 rotations can be implemented using keystrokes or pressing a certain key to rotate measurement dots 120 either clockwise or counterclockwise.

What is claimed is:

1. A method of providing a new and improved method for displaying results of phase identification measurements on a display device, said method comprising:
    taking one or more phase measurement on an energized conductor;
    displaying each said phase measurement on a phase attribute display on said display device;
    indicating a tagging reference phase of said energized conductor by moving said phase measurements displayed on said phase attribute display to indicate known phase attribute of said energized conductor; and
    saving said tagging reference phase in a configuration file on said display device.

2. The method as claimed in claim 1 wherein said phase attribute display 100 or 200 is composed of outer circle 150, inner circle 155, spokes 160 every 15 degrees between inside said outer circle 150 and said inner circle 155, primary phase attributes 101 every 120 degrees around said outer circle 150, secondary phase attributes 201 every 30 degrees around said outer circle 150, and three phase attributes 301 every 60 degrees around said outer circle 150.

3. The method as claimed in claim 2 wherein each said phase measurement is displayed as a dot 120 between said outer circle 150 and said inner circle 155.

4. The method as claimed in claim 3 wherein first said phase measurement dot 120 is displayed at a radius slightly less than radius of said outer circle 150, and subsequent said phase measurement dots 120 are each displayed at a radius slightly less than preceding said phase measurement dot 120.

5. The method as claimed in claim 2 further comprising a circuit type designation 125 displayed inside said inner circle 155.

6. The method as claimed in claim 2 wherein said indicating tagging reference phase of said energized conductor is implemented by rotating all said phase measurement dots 120 around center of said outer circle 150.

7. The method as claimed in claim 6 wherein said rotating all said phase measurement dots 120 is implemented on a touch screen display by a finger touching and moving said finger inside said outer circle 150 to rotate all said phase measurement dots 120 around center of said outer circle 150.

8. The method as claimed in claim 6 wherein said rotating all said phase measurement dots 120 is implemented on a non-touch screen display device by using keystrokes to rotate all said phase measurement dots 120 around center of said outer circle 150.

9. The method as claimed in claim 1 further comprising saving said phase attribute display 100 or 200, said phase measurement dots 120, and said display device setup information in said configuration file.

10. The method as claimed in claim 9 further comprising returning said display device to previous saved state by loading said phase attribute display 100 or 200, said phase measurement dots 120, and said display device setup information from said configuration file.

11. The method as claimed in claim 2 further comprising coloring primary phase A, B, and C spokes black, all other phase A attributes and spokes a first color, all phase B attributes and spokes a second color, and all phase C attributes and spokes a third color.

12. A method of providing a new and improved method for displaying results of phase identification measurements on a display device, said method comprising:
    taking actual phase measurements when approaching, moving under, or moving away from actual energized conductors;
    displaying said actual phase measurements on said display device;
    comparing shape of said actual phase measurements on said display device to shape of simulated phase measurements from a similar conductor configuration, and
    identifying phase of said actual overhead energized conductors as equal to phase of said similar conductor configuration whose shape of said simulated phase measurements most closely match said actual phase measurements.

\* \* \* \* \*